US010971197B2

(12) United States Patent
Tezuka

(10) Patent No.: US 10,971,197 B2
(45) Date of Patent: Apr. 6, 2021

(54) CONTROL CIRCUIT, SEMICONDUCTOR MEMORY DEVICE, INFORMATION PROCESSING DEVICE, AND CONTROL METHOD

(71) Applicant: SONY SEMICONDUCTOR SOLUTIONS CORPORATION, Kanagawa (JP)

(72) Inventor: Hiroyuki Tezuka, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/490,159

(22) PCT Filed: Feb. 14, 2018

(86) PCT No.: PCT/JP2018/005125
§ 371 (c)(1),
(2) Date: Aug. 30, 2019

(87) PCT Pub. No.: WO2018/163737
PCT Pub. Date: Sep. 13, 2018

(65) Prior Publication Data
US 2020/0020366 A1   Jan. 16, 2020

(30) Foreign Application Priority Data
Mar. 9, 2017   (JP) .................. 2017-045014

(51) Int. Cl.
*G11C 11/00* (2006.01)
*G11C 7/08* (2006.01)
(Continued)

(52) U.S. Cl.
CPC .................. *G11C 7/08* (2013.01); *G11C 7/14* (2013.01); *G11C 11/1673* (2013.01); *G11C 11/1675* (2013.01)

(58) Field of Classification Search
CPC ..... G11C 11/16; G11C 11/15; G11C 13/0069; G11C 13/0004; G11C 13/0007; H01L 43/08; H01L 27/228
(Continued)

(56) References Cited

U.S. PATENT DOCUMENTS

2013/0016553 A1\* 1/2013 Rao ...................... G11C 13/004
                                                                  365/158

FOREIGN PATENT DOCUMENTS

JP       2002-015563 A      1/2002
JP       2009-140576 A      6/2009
(Continued)

OTHER PUBLICATIONS

International Search Report and Written Opinion of PCT Application No. PCT/JP2018/005125, dated Mar. 27, 2018, 09 pages of ISRWO.

*Primary Examiner* — Son T Dinh
(74) *Attorney, Agent, or Firm* — Chip Law Group

(57) ABSTRACT

To provide a control circuit capable of reliably generating a reference potential while suppressing increase in power consumption and cost. Provided is a control circuit that performs control to separate from a sense amplifier a second reference element set to a predetermined resistance state, which is different from a first reference element set to a predetermined resistance state and connected to the sense amplifier in generating a reference potential used for data read through the sense amplifier from a memory cell.

8 Claims, 11 Drawing Sheets

(51) Int. Cl.
*G11C 7/14* (2006.01)
*G11C 11/16* (2006.01)
(58) Field of Classification Search
USPC .................................................. 365/158, 148
See application file for complete search history.

(56) References Cited

FOREIGN PATENT DOCUMENTS

| JP | 2017-021877 A | 1/2017 |
| TW | 200941482 A | 10/2009 |
| WO | 2009/073221 A1 | 6/2009 |
| WO | 2017/010147 A1 | 1/2017 |

* cited by examiner

FIG. 7

| NUMBER OF TIMES OF RD | RH0 | RL0 | RH1 | RL1 |
|---|---|---|---|---|
| FIRST TIME | RD | RD | RREF | RREF |
| SECOND TIME | RREF | RREF | RD | RD |
| ... | \multicolumn{4}{c}{RD/RREF ALTERNATELY} | | | |

FIG. 8

| NUMBER OF TIMES OF RD | RH0 | RL0 | RH1 | RL1 |
|---|---|---|---|---|
| FIRST TIME | RD | RD | — | RREF |
| SECOND TIME | RD | — | RREF | RD |
| THIRD TIME | — | RREF | RD | RD |
| FOURTH TIME | RREF | RD | RD | — |
| ... | \multicolumn{4}{c}{RREF SEQUENTIALLY} | | | |

FIG. 9

| TOTAL NUMBER OF TIMES OF WR/RD | RH0 | RL0 | RH1 | RL1 |
|---|---|---|---|---|
| FIRST TIME (WR) | — | — | — | RREF |
| SECOND TIME (RD) | RD | — | RREF | RD |
| THIRD TIME (WR) | — | RREF | — | — |
| FOURTH TIME (RD) | RREF | RD | RD | — |
| ... | \multicolumn{4}{c}{RREF SEQUENTIALLY} | | | |

CONTROL CIRCUIT, SEMICONDUCTOR MEMORY DEVICE, INFORMATION PROCESSING DEVICE, AND CONTROL METHOD

CROSS REFERENCE TO RELATED APPLICATIONS

This application is a U.S. National Phase of International Patent Application No. PCT/JP2018/005125 filed on Feb. 14, 2018, which claims priority benefit of Japanese Patent Application No. JP 2017-045014 filed in the Japan Patent Office on Mar. 9, 2017. Each of the above-referenced applications is hereby incorporated herein by reference in its entirety.

TECHNICAL FIELD

The present disclosure relates to a control circuit, a semiconductor memory device, an information processing device, and a control method.

BACKGROUND ART

As a method of generating a reference potential of a sense amplifier in a spin transfer torque magnetoresistive random access memory (STT-MRAM), known is a method of providing a reference cell in which a plurality of memory cells is connected in parallel and in series, and using the reference cell as a reference resistor at the time of reference potential generation. Furthermore, there is also a technology of, in order to set a combined resistance value of a reference cell to a desired value between high resistance (RH) and low resistance (RL), mounting a plurality of RH and RL cells, and making the ratio of each cell variable (Patent Documents 1 and 2 and the like).

In a memory device using a magnetic tunnel junction (MTJ) element, information stored in the MTJ element may be unintentionally inverted. Therefore, periodic refresh operation (rewrite operation) is required for reliable reading. For example, Patent Document 3 discloses a technology for performing refresh operation on a reference cell in parallel with write operation to a memory cell.

CITATION LIST

Patent Document

Patent Document 1: Japanese Patent Application Laid-Open No. 2009-187631
Patent Document 2: Japanese Patent Application Laid-Open No. 2013-4151
Patent Document 3: PCT Japanese Translation Patent Publication No. 2013-524392

SUMMARY OF THE INVENTION

Problems to be Solved by the Invention

However, performing refresh operation on a reference cell in parallel with write operation to a memory cell not only increases the power consumption but also leads to an increase in chip cost due to the increase in peak current.

Thus, the present disclosure proposes a novel and improved control circuit, a semiconductor memory device, an information processing device, and a control method that can reliably generate a reference potential while suppressing an increase in power consumption and an increase in cost.

Solutions to Problems

According to the present disclosure, provided is a control circuit that performs control to separate from a sense amplifier a second reference element set to a predetermined resistance state, the second reference element being different from a first reference element set to a predetermined resistance state and connected to the sense amplifier in generating a reference potential used for data read through the sense amplifier from a memory cell.

Furthermore, according to the present disclosure, provided is a semiconductor memory device including: a memory cell; a first reference element set to a predetermined resistance state in generating a reference potential used for data read through a sense amplifier from the memory cell; a second reference element set to a predetermined resistance state in generating the reference potential used for the data read through the sense amplifier from the memory cell; and a control circuit that performs control to connect the first reference element to the sense amplifier, and separate the second reference element from the sense amplifier in generating the reference potential used for the data read through the sense amplifier from the memory cell.

Furthermore, according to the present disclosure, there is provided an information processing device including at least one semiconductor memory device.

Furthermore, according to the present disclosure, provided is a control method including performing control by a processor to separate from the sense amplifier a second reference element set to a predetermined resistance state, the second reference element being different from a first reference element set to a predetermined resistance state and connected to the sense amplifier in generating a reference potential used for data read through the sense amplifier from a memory cell.

Effects of the Invention

As described above, the present disclosure can provide a novel and improved control circuit, a semiconductor memory device, an information processing device, and a control method that can reliably generate a reference potential while suppressing an increase in power consumption and an increase in cost.

Note that the effect described above is not necessarily limitative, and any of the effects shown in the present specification or other effects that can be understood from the present specification may be exhibited together with the effect described above, or instead of the effect described above.

BRIEF DESCRIPTION OF DRAWINGS

FIG. 7 is an explanatory table for explaining operation of the semiconductor memory device 1 according to the same embodiment.

FIG. 8 is an explanatory table for explaining operation of the semiconductor memory device 1 according to the same embodiment.

FIG. 9 is an explanatory table for explaining operation of the semiconductor memory device 1 according to the same embodiment.

MODE FOR CARRYING OUT THE INVENTION

Figure 1:
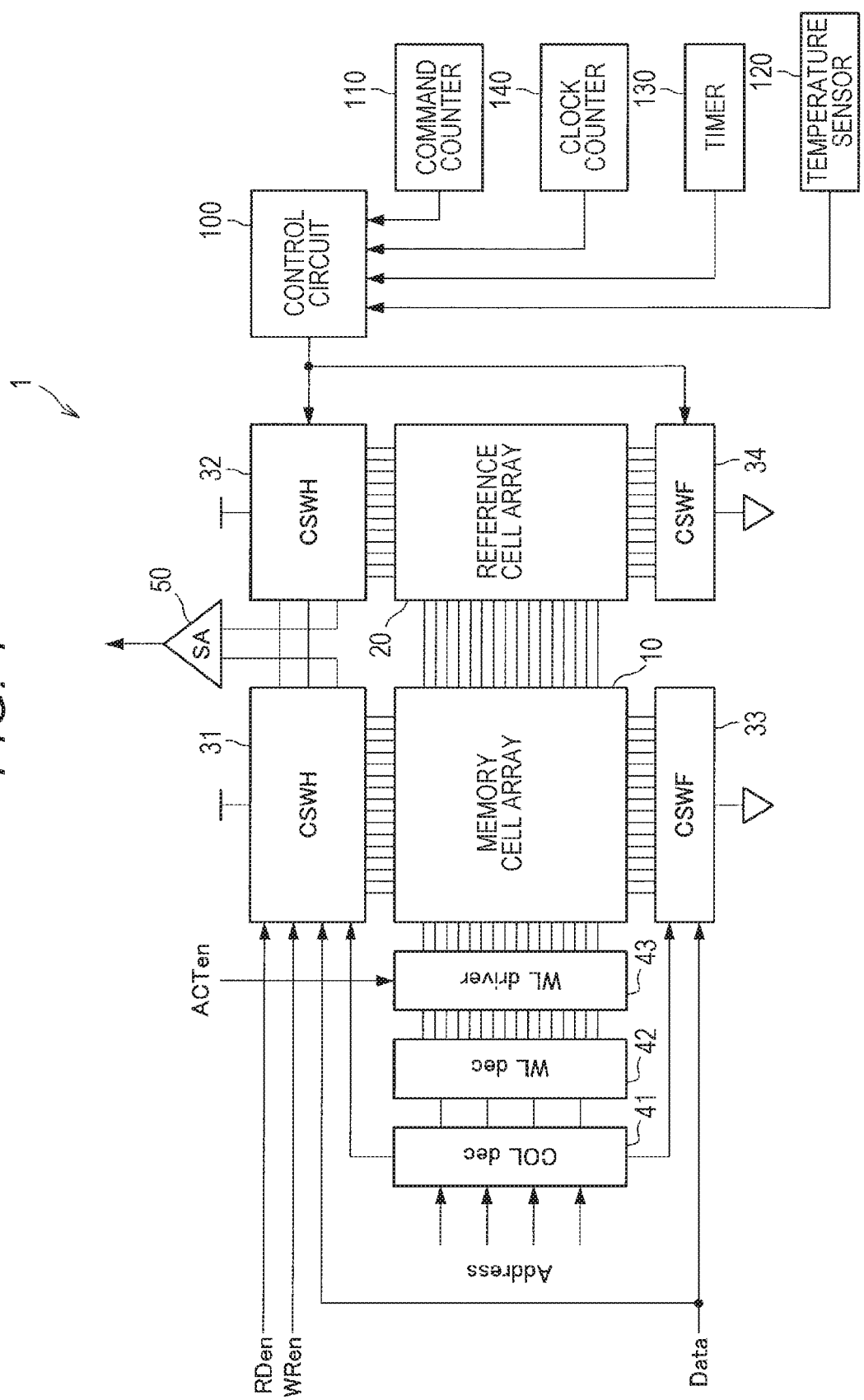
FIG. 1 is an explanatory diagram showing an example of a functional configuration of a semiconductor memory device according to an embodiment of the present disclosure.

Preferred embodiments of the present disclosure will be described in detail below with reference to the accompanying drawings. Note that, in the present specification and the drawings, the same reference numerals are given to the constituent elements having substantially the same functional configuration, and redundant explanations are omitted.

Note that the description will be given in the following order.
1. Embodiment of Present Disclosure
1.1. Overview
1.2. Configuration Example
2. Application Example
3. Conclusion

1. EMBODIMENT OF PRESENT DISCLOSURE 1.1. Overview

Before describing the embodiments of the present disclosure in detail, an overview of the embodiments of the present disclosure will be described.

As described above, as a method of generating a reference potential of a sense amplifier in a spin transfer torque magnetic random access memory (STT-MRAM), known is a method of providing a reference cell in which a plurality of memory cells is connected in parallel and in series, and using the reference cell as a reference resistor at the time of reference potential generation. Furthermore, there is also a technology of, in order to set a combined resistance value of reference cells to a desired value between high resistance (RH) and low resistance (RL), mounting a plurality of RH and RL cells, and making the ratio of each cell variable.

In a memory device using a magnetic tunnel junction (MTJ) element, information stored in the MTJ element may be unintentionally inverted by the following mechanism. Therefore, periodic refresh operation (rewrite operation) is required for reliable reading. In particular, unintended logic inversion is not allowed since a reference cell is accessed each time it is read and used as a reference for H/L determination of stored data.

Among the mechanisms that cause unintended logic inversion, a fatal one is a read disturb. This is a logic inversion which occurs with a certain probability even if a minute current applied at the time of reading is equal to or less than a write threshold, and is a phenomenon which cannot be ignored particularly in a reference cell accessed each time it is read. In order to prevent a read error due to this logic inversion, it is generally necessary to perform overwriting (refresh writing) of desired data also on a reference cell behind writing to a memory cell (in parallel with writing).

The following two points can be mentioned as the reasons for refreshing a reference cell in parallel with writing to a memory cell. The first point is that since the STT-MRAM aims at a non-volatile memory, it is not desired to make a user be aware of refresh operation. The second point is that even in a case of refreshing of a reference cell, a write pulse length equal to that of a normal cell is required, and in a case where a read command is issued during reference cell refresh at a timing other than writing, the reference cell refresh may be incomplete.

By the way, proposals have also been made to suppress the occurrence of the above-mentioned logic inversion. For example, Patent Document 2 listed above proposes an arrangement of the configuration of a reference cell in which a read disturb is unlikely to occur. However, what has been proposed is limited to the configuration of a specific reference cell, and cannot be applied to an arbitrary combination of reference cells. In order to achieve a more efficient and higher-quality readout circuit, a reference cell with a configuration different from that proposed in Patent Document 2 may be assumed, so that it is necessary to consider a circuit and a control method on the basis of an arbitrary configuration.

On the other hand, one of the disadvantages in refreshing a reference cell in parallel with writing to a memory cell is an increase in current consumption. In the current writing type STT-MRAM, the power at the time of writing is inherently high, and an increase in the number of cells to be written leads to an increase in peak current. An increase in peak current directly leads to an increase in chip resources such as a write circuit and a wiring area, which also leads to an increase in chip cost. Furthermore, when the power consumption increases, the consumption of the battery increases in the mobile product, leading to a decrease in the operation time, which may greatly damage the product value. Furthermore, an increase in heat generation leads to a decrease in product performance and a deterioration in product life, and causes a further increase in cost such as the need for measures and members to prevent them.

In view of the above, when considering the practical application of the STT-MRAM and the improvement of its value, it is considered that the suppression of power consumption is highly important, and the reduction of operating power is strongly demanded. On the other hand, in order to maintain the function as a memory, it is also necessary to reliably prevent the aforementioned logic inversion. Accordingly, the above points need to be cleared simultaneously.

Therefore, in view of the above-mentioned point, the present disclosure person has diligently studied about a technology for achieving both reliable prevention of logic inversion of a reference cell and suppression of power consumption. As a result, the present disclosure person came to devise a technology for achieving both reliable prevention of logic inversion of a reference cell and suppression of power consumption, as described below.

1.2. Configuration Example

Subsequently, an embodiment of the present disclosure will be described in detail. FIG. 1 is an explanatory diagram showing an example of a functional configuration of a semiconductor memory device according to an embodiment of the present disclosure. An example of a functional configuration of the semiconductor memory device according to the embodiment of the present disclosure will be described below with reference to FIG. 1.

As shown in FIG. 1, a semiconductor memory device 1 according to the embodiment of the present disclosure includes a memory cell array 10, a reference cell array 20, column control switches 31 and 32 on a VDD side, column control switches 33 and 34 on a VSS side, a column decoder 41, a word line decoder 42, a word line driver 43, a sense amplifier 50, a control circuit 100, a command counter 110, a temperature sensor 120, a timer 130, and a clock counter 140.

The memory cell array 10 includes memory cells having memory elements arranged in a matrix. In the present embodiment, as the memory element, an element is used which utilizes the fact that the resistance state changes reversibly in accordance with the polarity of the potential difference applied between both ends to store information. As such an element, an MTJ element can be used as described above. The memory element has two distinguishable resistance states (a low resistance state and a high resistance state). Furthermore, the memory cell array 10 also has a plurality of word lines extending in a row direction (horizontal direction), and a plurality of bit lines and a plurality of source lines extending in a column direction (vertical direction). One end of each word line is connected to the word line driver 43, and each bit line is connected to the column control switch 31 on the VDD side and the column control switch 33 on the VSS side.

The reference cell array 20 has a plurality of reference cells arranged in a matrix. Furthermore, as similar to the memory cell array 10, the reference cell array 20 has a plurality of word lines extending in a row direction (horizontal direction), and a plurality of bit lines and a plurality of source lines extending in a column direction (vertical direction). One end of each word line is connected to the word line driver 43, and each bit line is connected to the column control switch 32 on the VDD side and the column control switch 34 on the VSS side.

In the present embodiment, the reference cells provided in the reference cell array 20 have a high resistance reference cell and a low resistance reference cell. With the high resistance reference cell and the low resistance reference cell, the combined resistance value of the reference cells is made to be a desired value between high resistance and low resistance.

The column control switches 31 to 34 connect a bit line and a source line related to a memory cell to be driven among a plurality of bit lines and source lines of the memory cell array 10 to a bit line drive unit and a source line drive unit not shown on the basis of control signals. The control signals supplied to the column control switches 31 to 34 include a read enable signal RDen and a write enable signal WRen. Furthermore, a data signal Data and a signal from the column decoder 41 (a decoded column address signal) are sent to the column control switches 31 to 34.

The column decoder 41 decodes the address signal and sends the decoded signal to the column control switches 31 to 34. The word line decoder 42 decodes the address signal and sends the decoded signal to the word line driver 43. The word line driver 43 selects a memory cell to be driven in the memory cell array 10 on the basis of a control signal. Specifically, the word line driver 43 applies a signal to the word line of the memory cell array 10 to select the row to which the memory cell to be subjected to the data write or read operation belongs. In addition to the signal from the word line decoder 42, a signal ACTen for activating the word line is sent to the word line driver 43.

When reading data from the memory cell of the memory cell array 10, the sense amplifier 50 compares the potential output through the bit line with the reference potential generated by the reference cell of the reference cell array 20, and outputs data indicating whether the potential is higher (H) or lower (L) than the reference potential.

Figure 2:
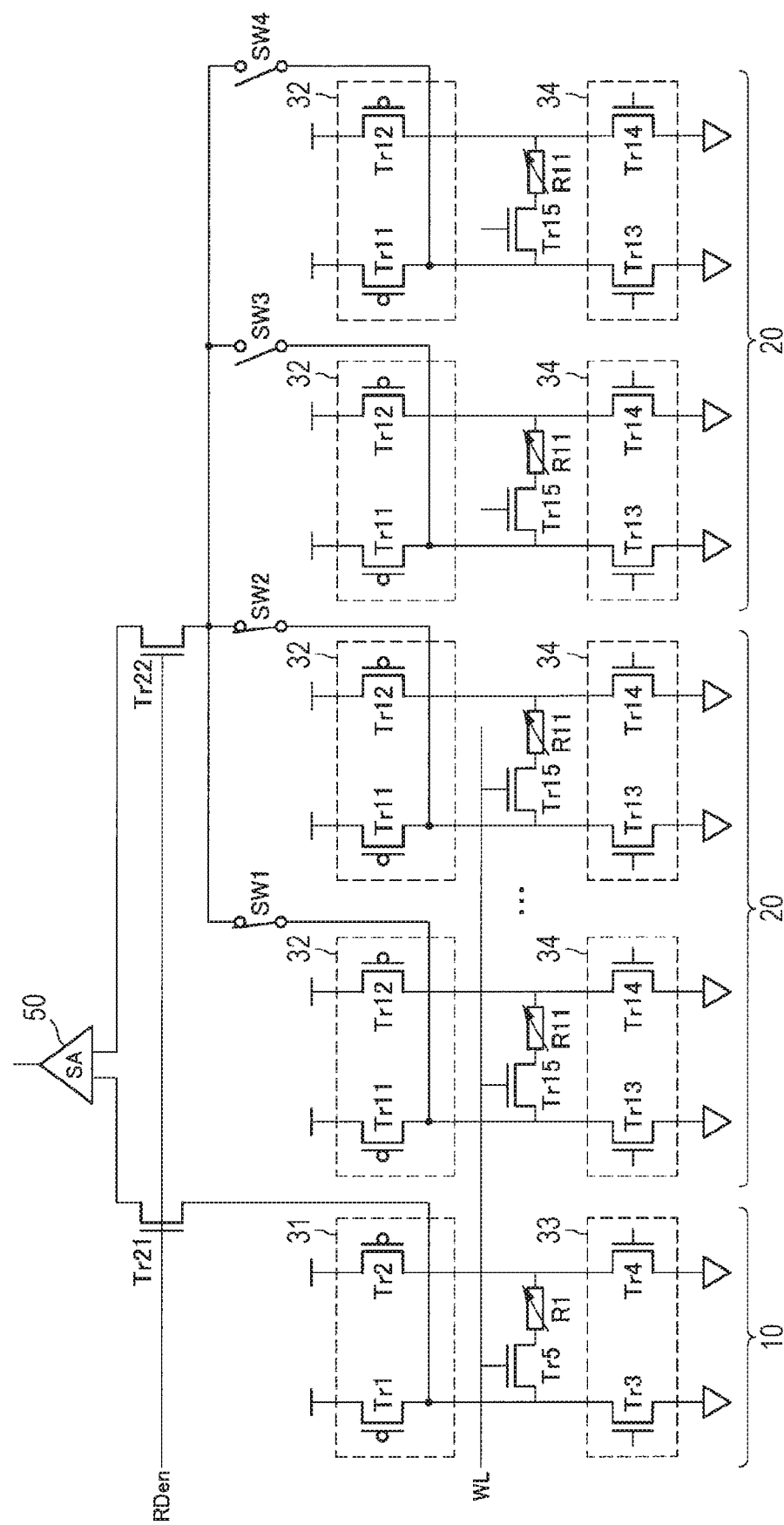
FIG. 2 is an explanatory diagram showing a circuit configuration example of a memory cell array 10, a reference cell array 20 and their periphery.

Here, an example of a circuit configuration of the memory cell array 10, the reference cell array 20 and their periphery are shown. FIG. 2 is an explanatory diagram showing an example of a circuit configuration of the memory cell array 10, the reference cell array 20, and their periphery.

The column control switch 31 includes MOS transistors Tr1 and Tr2. The column control switch 32 includes MOS transistors Tr11 and Tr12. The column control switch 33 includes MOS transistors Tr3 and Tr4. The column control switch 32 includes MOS transistors Tr13 and Tr14. Furthermore, a MOS transistor Tr21 is provided between the column control switch 31 and the sense amplifier 50, and a MOS transistor Tr22 is provided between the column control switch 32 and the sense amplifier 50. The MOS transistors Tr21 and Tr22 are switched on and off by the read enable signal RDen.

The memory cell array 10 has a configuration in which memory cells having a selection transistor Try and a memory element R1 are arranged on a matrix. Note that, in FIG. 2, in order to simplify the description, the memory cell array 10 is shown in which only one memory cell is provided.

The reference cell array 20 has a configuration in which reference cells having a selection transistor Tr15 and a memory element R11 are arranged on a matrix. Then, switches SW1 to SW4 for switching between connection and disconnection between each reference cell of the reference cell array 20 and the sense amplifier 50 are provided corresponding to each reference cell. The on/off switching of the switches SW1 to SW4 can be performed by, for example, a signal output from the control circuit 100.

Figure 3:
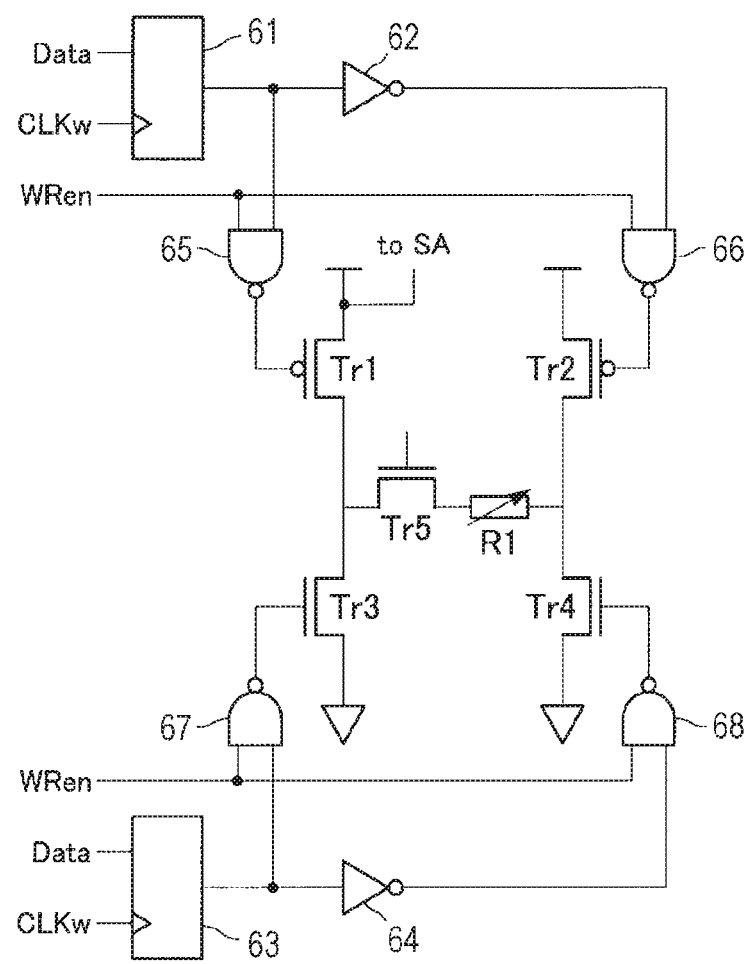
FIG. 3 is an explanatory diagram showing an example of a circuit configuration of the memory cell array 10 and a periphery of the memory cell array 10.

FIG. 3 is an explanatory diagram showing an example of a circuit configuration of the memory cell array 10 and a periphery of the memory cell array 10. The peripheral circuits of the memory cell array 10 shown in FIG. 3 are circuits for performing write operation on a memory cell. FIG. 3 shows registers 61 and 63, NOT gates 62 and 64, NAND gates 65 to 68, the transistors Tr1 to Try, and the memory element R1. In the memory cell array 10, when one of the transistors Tr1 and Tr2 is turned on and one of the transistors Tr3 and Tr4 is turned on by the NOT gates 62 and 64, writing of data to the memory element R1 can be performed, in other words, the resistance state of the memory element R1 can be changed.

Figure 4:
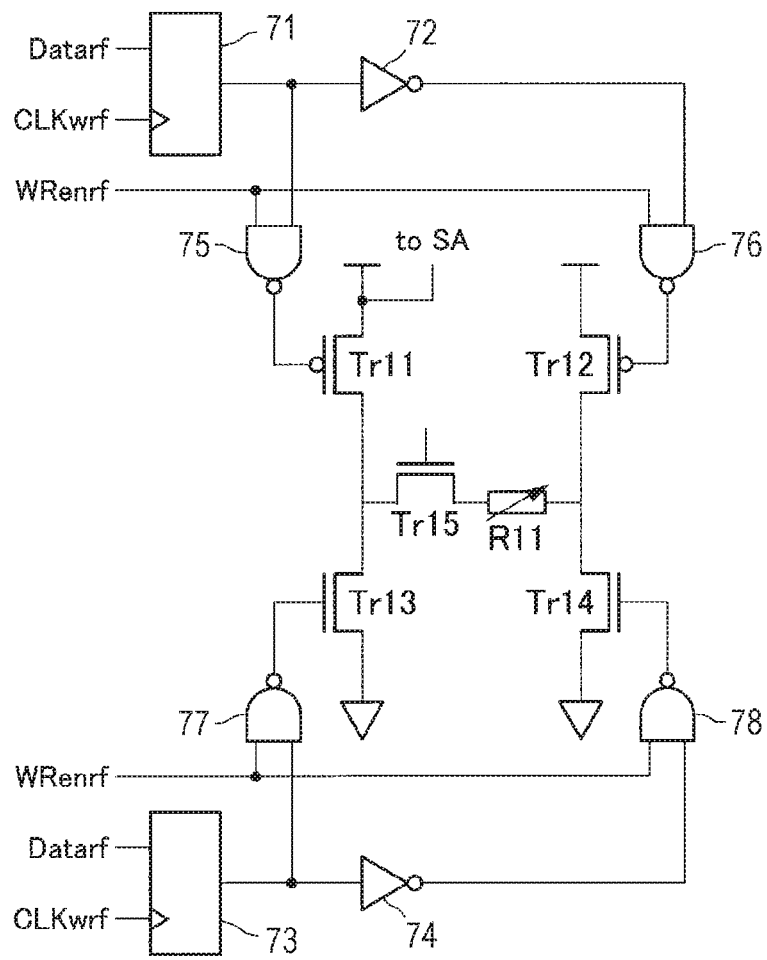
FIG. 4 is an explanatory diagram showing an example of a circuit configuration of the reference cell array 20 and a periphery of the reference cell array 20.
Figure 5:
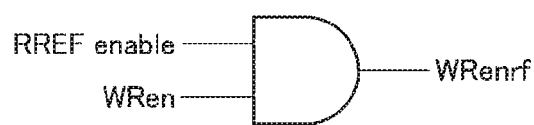
FIG. 5 is an explanatory diagram showing an AND gate.

FIG. 4 is an explanatory diagram showing an example of a circuit configuration of the reference cell array 20 and a periphery of the reference cell array 20. The circuit in the periphery of the reference cell array 20 shown in FIG. 4 is a circuit for performing write operation on the reference cell. FIG. 4 shows registers 71 and 73, NOT gates 72 and 74, NAND gates 75 to 78, the transistors Tr11 to Tr15, and the memory element R11. Furthermore, FIG. 5 is an explanatory diagram showing an AND gate, and is an explanatory diagram showing an AND gate 79 that generates a write enable signal WRenrf to the reference cell from a refresh enable signal RREF enable and a write enable signal WRen. In other words, the write enable signal WRenrf becomes 1 if one of the refresh enable signal RREF enable and the write enable signal WRen becomes 1. In the reference cell array 20, when one of the transistors Tr11 and Tr12 is turned on and one of the transistors Tr13 and Tr14 is turned on by the NOT gates 72 and 74, writing of data to the memory element R11 can be performed, in other words, the resistance state of the memory element R11 can be changed.

The control circuit 100 is a circuit that controls the refresh operation for the reference cell array 20. In the present embodiment, as described below, the refresh operation is changed between the high resistance reference cell and the low resistance reference cell. More specifically, the control circuit 100 operates to perform the refresh operation with respect to the reference cell in which the read disturb easily occurs more frequently than the reference cell in which the read disturb does not easily occur. In other words, the control circuit 100 independently outputs a refresh enable signal for performing refresh operation for each reference cell. Furthermore, which of the high resistance state and the low resistance state is susceptible to the read disturb depends on the circuit configuration.

The command counter 110 counts the number of times the write command and the read command have been issued, and outputs the counted value to the control circuit 100. The control circuit 100 performs refresh operation on the reference cell array 20 on the basis of the value counted by the command counter 110, and performs switching of the switches SW1 to SW4.

The temperature sensor 120 senses the temperature in the periphery of the memory cell array 10 and the reference cell array 20, and outputs the sensing result to the control circuit 100. The control circuit 100 performs refresh operation on the reference cell array 20 on the basis of the sensing result of the temperature sensor 120. For example, the control circuit 100 may change the pattern of the refresh operation on the reference cell array 20 depending on whether the temperature sensed by the temperature sensor 120 is equal to or higher than a predetermined threshold or less than the threshold.

The timer 130 measures time. The control circuit 100 may perform the refresh operation or switching of the switches SW1 to SW4 according to an execution signal issued from the timer 130 at a desired time interval, instead of according to the number of issued commands. Furthermore, this time interval may be set appropriately by a register.

The clock counter 140 counts the number of clocks. The control circuit 100 may use the value counted by the clock counter 140 at the time of refresh operation or switching of the switches SW1 to SW4 instead of the above-described time measuring by the timer.

Figure 6:
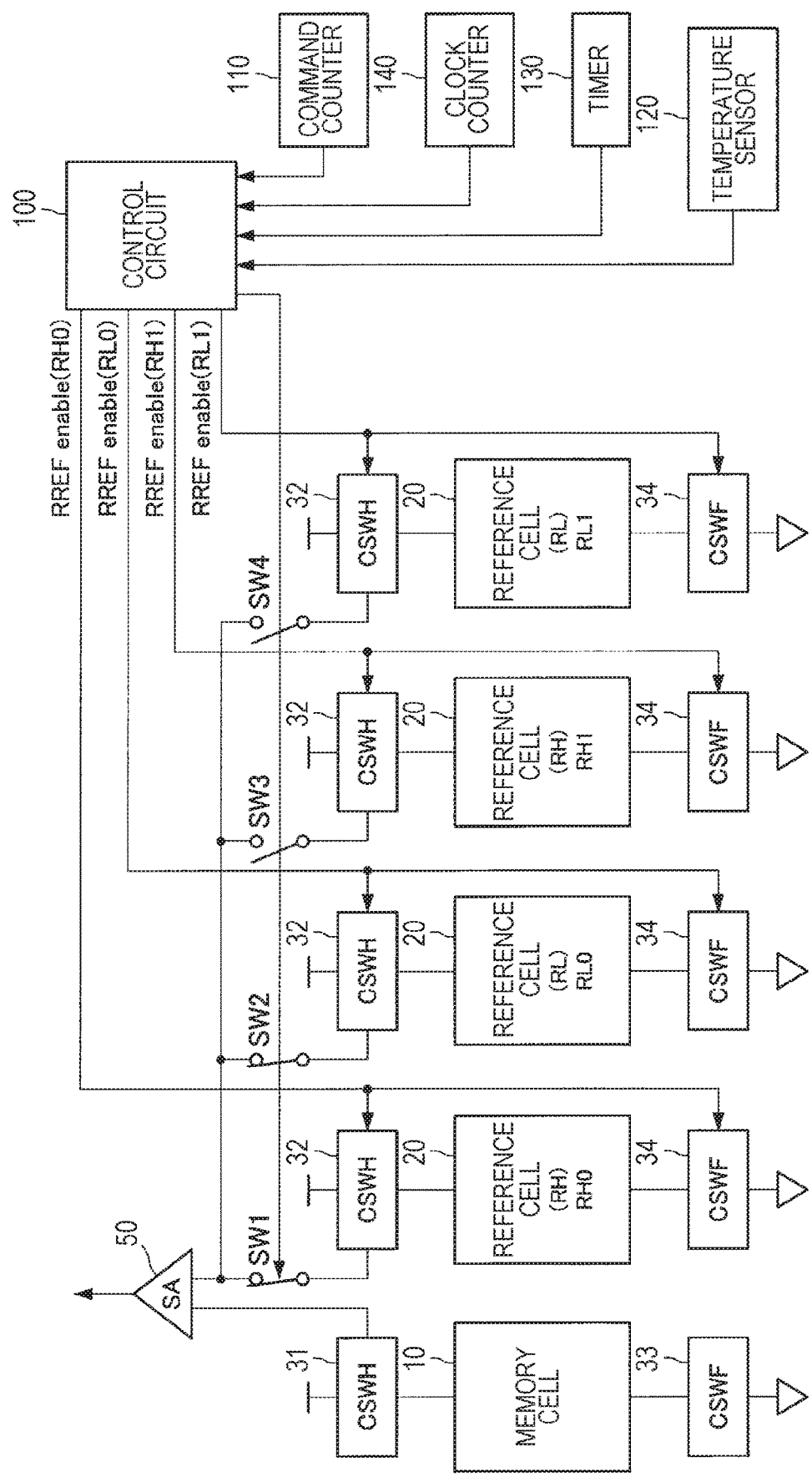
FIG. 6 is an explanatory diagram showing an example of a functional configuration of a semiconductor memory device 1 according to the same embodiment.

FIG. 6 is an explanatory diagram showing an example of a functional configuration of the semiconductor memory device 1 according to the present embodiment, and shows an example of a functional configuration of the semiconductor memory device 1 for changing the refresh operation between a high resistance reference cell and a low resistance reference cell.

FIG. 6 shows a configuration in which a normal memory cell is connected to one side of the sense amplifier 50, and one high resistance reference cell (RH) and one low resistance reference cell (RL) are connected in parallel as reference cells on the other side. Of course, the number of sets of the high resistance reference cell and the low resistance reference cell is not limited to two, and an example in which there are a plurality of such sets will be described later.

Then, in the present embodiment, the switches SW1 to SW4 are switched on and off by a predetermined signal output from the control circuit 100. In other words, connection and disconnection between each reference cell of the reference cell array 20 and the sense amplifier 50 are switched by a predetermined signal output from the control circuit 100. Then, the control circuit 100 outputs a signal for refreshing the reference cell in a state where the reference cell and the sense amplifier 50 are disconnected. At this time, the control circuit 100 outputs a predetermined signal for switching on and off of the switches SW1 to SW4 using information on the number of times of the read command and the write command output from the command counter 110.

FIG. 7 is an explanatory table for explaining operation of the semiconductor memory device 1 according to the embodiment of the present disclosure. For example, in a case where the first read command is issued, the semiconductor memory device 1 generates a reference potential using a high resistance reference cell RH0 and a low resistance reference cell RL0, and performs refresh operation on the high resistance reference cell RH1 and the low resistance reference cell RL1. In other words, in a case where the first read command is issued, the control circuit 100 outputs a signal to the switches SW1 and SW2 to connect the high resistance reference cell RH0 and the low resistance reference cell RL0 to the sense amplifier 50. Then, in a case where the first read command is issued, the control circuit 100 outputs a signal to the switches SW3 and SW4 to separate the high resistance reference cell RH1 and the low resistance reference cell RL1 from the sense amplifier 50.

In a case where the second read command is issued, the semiconductor memory device 1 generates a reference potential using a high resistance reference cell RH1 and a low resistance reference cell RL1, and performs refresh operation on the high resistance reference cell RH0 and the low resistance reference cell RL0. In other words, in a case where the second read command is issued, the control circuit 100 outputs a signal to the switches SW3 and SW4 to connect the high resistance reference cell RH1 and the low resistance reference cell RL1 to the sense amplifier 50. Then, in a case where the second read command is issued, the control circuit 100 outputs a signal to the switches SW1 and SW2 to separate the high resistance reference cell RH0 and the low resistance reference cell RL0 from the sense amplifier 50.

The control circuit 100 switches on/off of the switches SW1 to SW4 so that the refresh operation to the reference cells RH0 and RL0 and the refresh operation to the reference cells RH1 and RL1 are alternately performed. Thus, the control circuit 100 can perform the refresh operation only on the reference cells not used for generating the reference potential. Accordingly, the control circuit 100 can achieve both reliable prevention of the logic inversion of the reference cell and the suppression of the power consumption.

Another example will be shown. FIG. 8 is an explanatory table for explaining operation of the semiconductor memory device 1 according to the embodiment of the present disclosure. For example, in a case where the first read command is issued, the semiconductor memory device 1 generates a reference potential using a high resistance reference cell RH0 and a low resistance reference cell RL0, and performs refresh operation on the low resistance reference cell RL1. In other words, in a case where the first read command is issued, the control circuit 100 outputs a signal to the switches SW1 and SW2 to connect the high resistance reference cell RH0 and the low resistance reference cell RL0 to the sense amplifier 50. Then, in a case where the first read command is issued, the control circuit 100 outputs a signal to the switch SW4 to separate the high resistance reference cell RH1 and the low resistance reference cell RL1 from the sense amplifier 50.

In a case where the second read command is issued, the semiconductor memory device 1 generates a reference potential using a high resistance reference cell RH0 and a low resistance reference cell RL1, and performs refresh operation on the high resistance reference cell RH1. In other words, in a case where the second read command is issued, the control circuit 100 outputs a signal to the switches SW1 and SW4 to connect the high resistance reference cell RH1 and the low resistance reference cell RL0 to the sense amplifier 50. Then, in a case where the second read command is issued, the control circuit 100 outputs a signal to the switch SW3 to separate the high resistance reference cell RH1 and the low resistance reference cell RL0 from the sense amplifier 50.

Thereafter, the control circuit 100 switches on/off of the switches SW1 to SW4 so that the refresh operation is performed to the reference cell RL0, the reference cell RH0, the reference cell RL1, and the reference cell RH1 in this order each time a read command is issued. Thus, the control circuit 100 can perform the refresh operation only on the reference cells not used for generating the reference potential. Accordingly, the control circuit 100 can achieve both reliable prevention of the logic inversion of the reference cell and the suppression of the power consumption.

Furthermore, in the example shown in FIG. 8, the number of reference cells for which the refresh operation is performed is reduced to one as compared with the example shown in FIG. 7. In other words, the number of reference cells targeted for the refresh operation performed behind the read operation is smaller than that in the example shown in FIG. 7. As a result, the control circuit 100 can suppress the current consumption in the refresh operation performed behind the read operation to be lower than that in the example of FIG. 7.

Another example will be shown. FIG. 9 is an explanatory table for explaining operation of the semiconductor memory device 1 according to the embodiment of the present disclosure. What differs from the example of FIG. 8 is that the reference cell to be subjected to the refresh operation is switched according to issuance of not only the read command but also the write command.

For example, in a case where the first command (write command in the example of FIG. 9) is issued, the semiconductor memory device 1 performs the refresh operation on the low resistance reference cell RL1.

In a case where the second command (read command in the example of FIG. 9) is issued, the semiconductor memory device 1 generates a reference potential using a high resistance reference cell RH0 and a low resistance reference cell RL1, and performs refresh operation on the high resistance reference cell RH1. In other words, in a case where the second command is issued, the control circuit 100 outputs a signal to the switches SW1 and SW4 to connect the high resistance reference cell RH1 and the low resistance reference cell RL0 to the sense amplifier 50. Then, in a case where the second command is issued, the control circuit 100 outputs a signal to the switch SW3 to separate the high resistance reference cell RH1 and the low resistance reference cell RL0 from the sense amplifier 50.

Thereafter, the control circuit 100 switches on/off of the switches SW1 to SW4 so that the refresh operation is performed to the reference cell RL0, the reference cell RH0, the reference cell RL1, and the reference cell RH1 in this order each time a read command or a write command is issued. Thus, the control circuit 100 can perform the refresh operation only on the reference cells not used for generating the reference potential. Accordingly, the control circuit 100 can achieve both reliable prevention of the logic inversion of the reference cell and the suppression of the power consumption.

Furthermore, in the example shown in FIG. 9, as compared with the example shown in FIG. 8, the reference cell to be subjected to the refresh operation is switched on the basis of issuance of not only the read command but also the write command. In other words, the frequency of the refresh operation is higher than that in the example shown in FIG. 8.

As described above, the semiconductor memory device 1 according to the present embodiment can switch the reference cell to be subjected to the refresh operation, according to the issuance of the command. Furthermore, using the output from the timer 130 and the clock counter 140, the semiconductor memory device 1 according to the present embodiment can switch the reference cell to be subjected to the refresh operation, without being related to the issuance of the command.

However, if the switches SW1 to SW4 are switched while the read command is issued and the read operation is being performed, the sensing of data in the sense amplifier 50 is affected. Furthermore, when the refresh operation of the reference cell is interrupted in response to the read command being issued and the read operation being performed, the refresh of the reference cell becomes incomplete.

Therefore, if a read command is issued during the refresh of the reference cell, the control circuit 100 switches on/off of the switches SW1 to SW4 after the read operation by the read command is completed.

Figure 10:
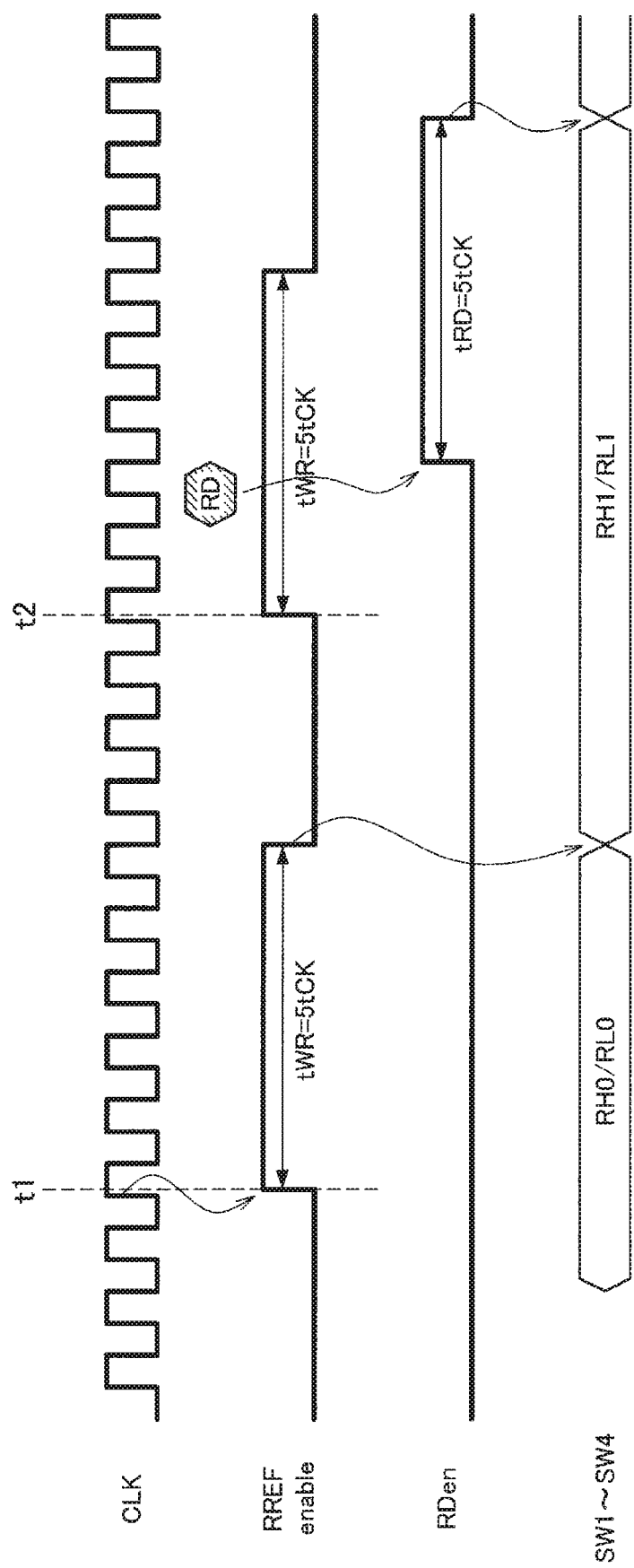
FIG. 10 is an explanatory diagram showing operation of the semiconductor memory device 1 according to the same embodiment in a timing chart.

FIG. 10 is an explanatory diagram showing operation of the semiconductor memory device 1 according to the present embodiment in a timing chart. For example, it is assumed that the control circuit 100 changes the refresh enable signal to the low level when five clocks elapse after the refresh enable signal becomes the high level, and switches on/off of the switches SW1 to SW4 according to the change to the low level. When the refresh enable signal becomes the high level at time t1 in the timing chart of FIG. 10, and the refresh enable signal becomes the low level after five clocks, the control circuit 100 switches the connection to the sense amplifier 50 from the reference cells RH0 and RL0 to the reference cells RH1 and RL1.

Thereafter, it is assumed that the refresh enable signal becomes the high level again at time t2 in the timing chart of FIG. 10, but thereafter, a read command is generated before 5 clocks elapse, and the signal RDen becomes the high level. In this case, the control circuit 100 does not change the refresh enable signal to the low level even if five clocks have elapsed after the refresh enable signal becomes the high level. Then, the control circuit 100 changes the refresh enable signal to the low level when five clocks have elapsed after the signal RDen becomes the high level, and switches the connection to the sense amplifier 50 from the reference cells RH1 and RL1 to the reference cell RH0 and RL0.

Alternatively, the control circuit 100 may change the time from the high level to the low level of the refresh enable signal according to the output value of the temperature sensor 120, for example.

As described above, the semiconductor memory device 1 according to the present embodiment can not only perform the refresh operation on the reference cell at an arbitrary timing, but also can improve the reliability of the read operation from the memory cell while maintaining the freedom of access to the reference cell.

Figure 11:
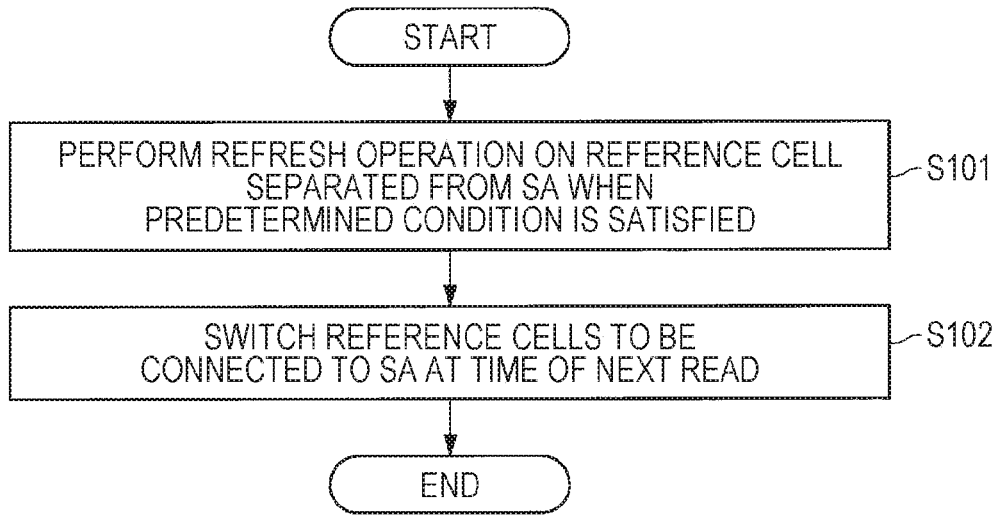
FIG. 11 is a flow chart showing an operation example of the semiconductor memory device 1 according to the same embodiment.

Subsequently, an example of operation of the semiconductor memory device 1 according to the present embodiment will be described. FIG. 11 is a flow chart showing an operation example of the semiconductor memory device 1 according to the present embodiment.

The semiconductor memory device 1 issues a refresh enable signal from control circuit 100 only to at least a part of the reference cells separated from the sense amplifier 50 by switches SW1 to SW4 when a predetermined condition is satisfied (step S101). The predetermined condition is, for example, that the write command has been issued.

When the refresh enable signal is issued from the control circuit 100 only to at least a part of the reference cells separated from sense amplifier 50, subsequently, the semiconductor memory device 1 performs refresh on the reference cell that has received the refresh enable signal. Then, the semiconductor memory device 1 connects the reference cell to be subjected to the refresh operation when the predetermined condition is satisfied next, to the sense amplifier 50 (step S102).

Figure 12:
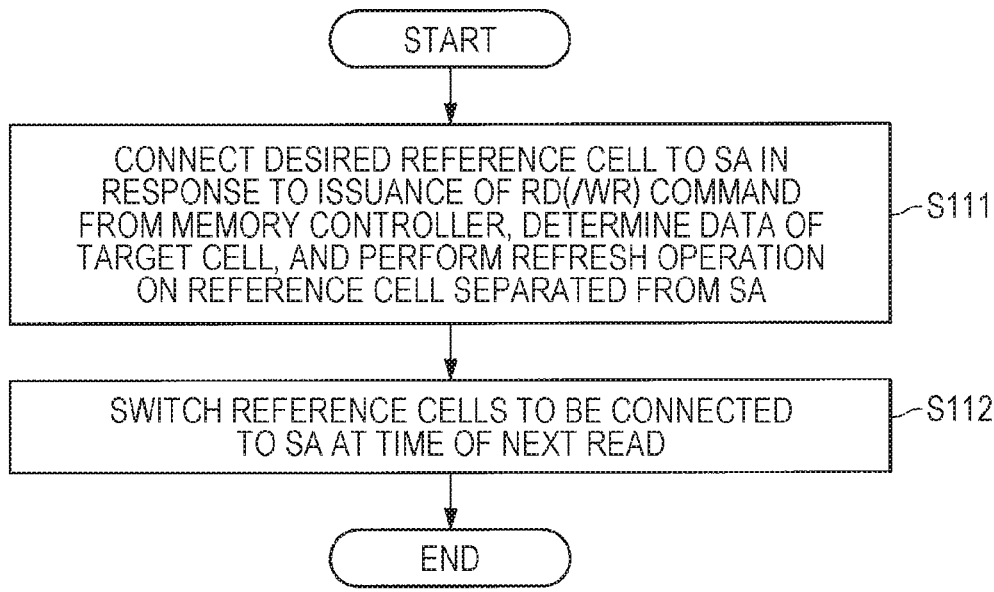
FIG. 12 is a flow chart showing another operation example of the semiconductor memory device 1 according to the same embodiment.

FIG. 12 is a flow chart showing another operation example of the semiconductor memory device 1 according to the present embodiment. The semiconductor memory device 1 connects the reference cell used to generate the reference potential to the sense amplifier 50 on the basis of the issuance of the read command (or the write command), determines the data of the memory cell of the target, and performs the refresh operation only on at least a part of the reference cells that have been separated from the sense amplifier 50 (step S111).

When the refresh enable signal is issued from the control circuit 100 only to at least a part of the reference cells separated from sense amplifier 50, subsequently, the semiconductor memory device 1 performs refresh on the reference cell that has received the refresh enable signal. Then, the semiconductor memory device 1 connects the reference cell to be subjected to the refresh operation when the predetermined condition is satisfied next, to the sense amplifier 50 (step S112).

Figure 13:
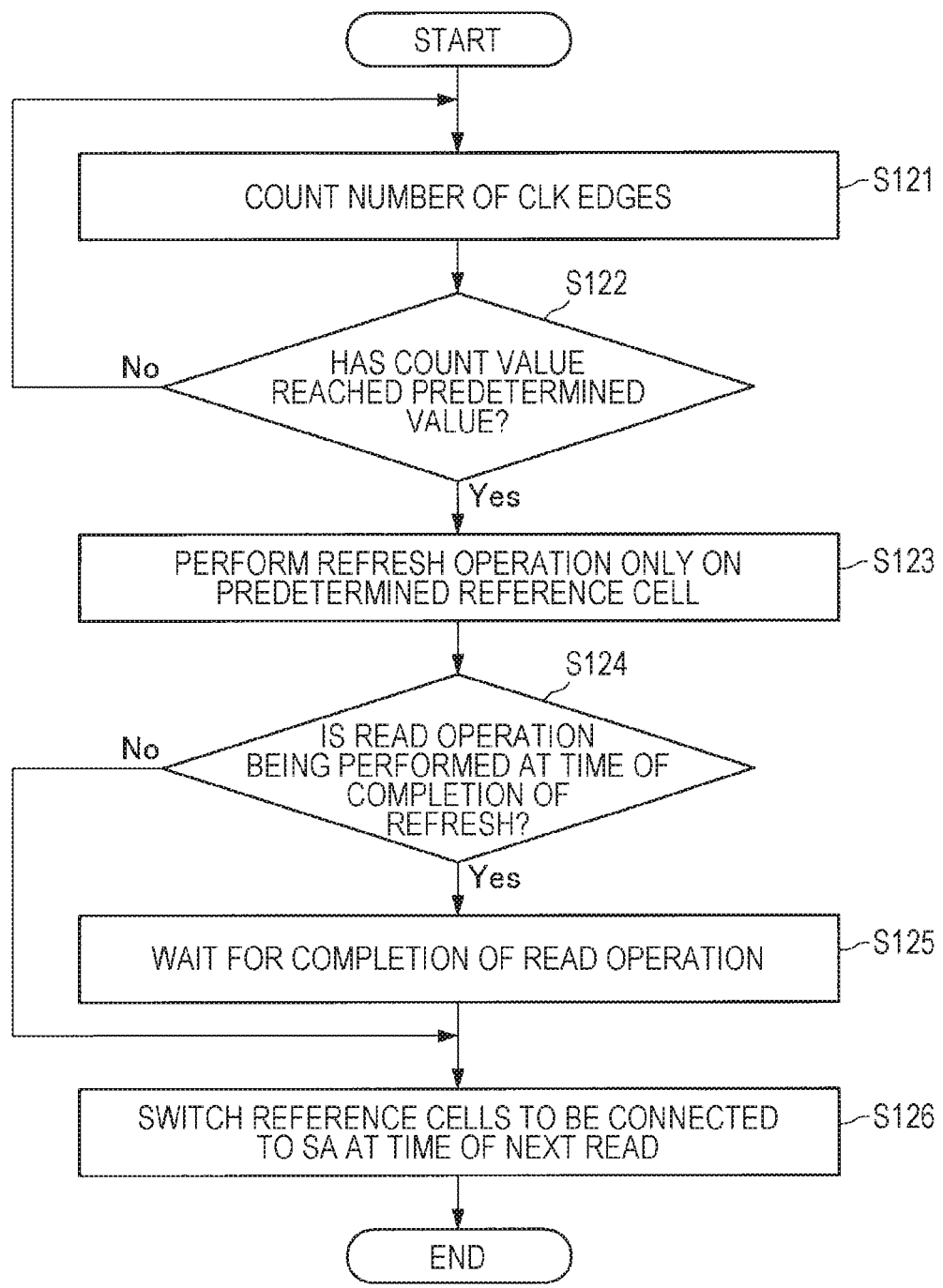
FIG. 13 is a flow chart showing another operation example of the semiconductor memory device 1 according to the same embodiment.

FIG. 13 is a flow chart showing another operation example of the semiconductor memory device 1 according to the present embodiment. The semiconductor memory device 1 counts the number of clock edges (step S121), and determines whether the count value has reached a predetermined value (step S122). The control circuit 100 performs this determination, for example. If the count value has not reached the predetermined value (No in step S122), the semiconductor memory device 1 returns to the processing of step S121. On the other hand, if the count value has reached the predetermined value (Yes in step S122), the semiconductor memory device 1 performs the refresh operation only on a predetermined reference cell, in other words, at least a part of the reference cell separated from the sense amplifier (step S123).

The semiconductor memory device 1 determines whether read operation is being performed on a memory cell during the refresh operation on the predetermined reference cell (step S124). The control circuit 100 performs this determination, for example. If the read operation on the memory cell is being performed during the refresh operation (Yes in step S124), the semiconductor memory device 1 waits for the completion of the read operation (step S125). The semiconductor memory device 1 waits for the completion of the read operation, for example, by the time measuring of the timer 130 or the counting of the clock counter 140. If the read operation on the memory cell is not performed during the refresh operation (No in step S124), or if the read operation is completed, the semiconductor memory device 1 connects the reference cell to be subjected to the refresh operation when the predetermined condition is satisfied next, to the sense amplifier 50 (step S125).

2. APPLICATION EXAMPLE

Figure 14:
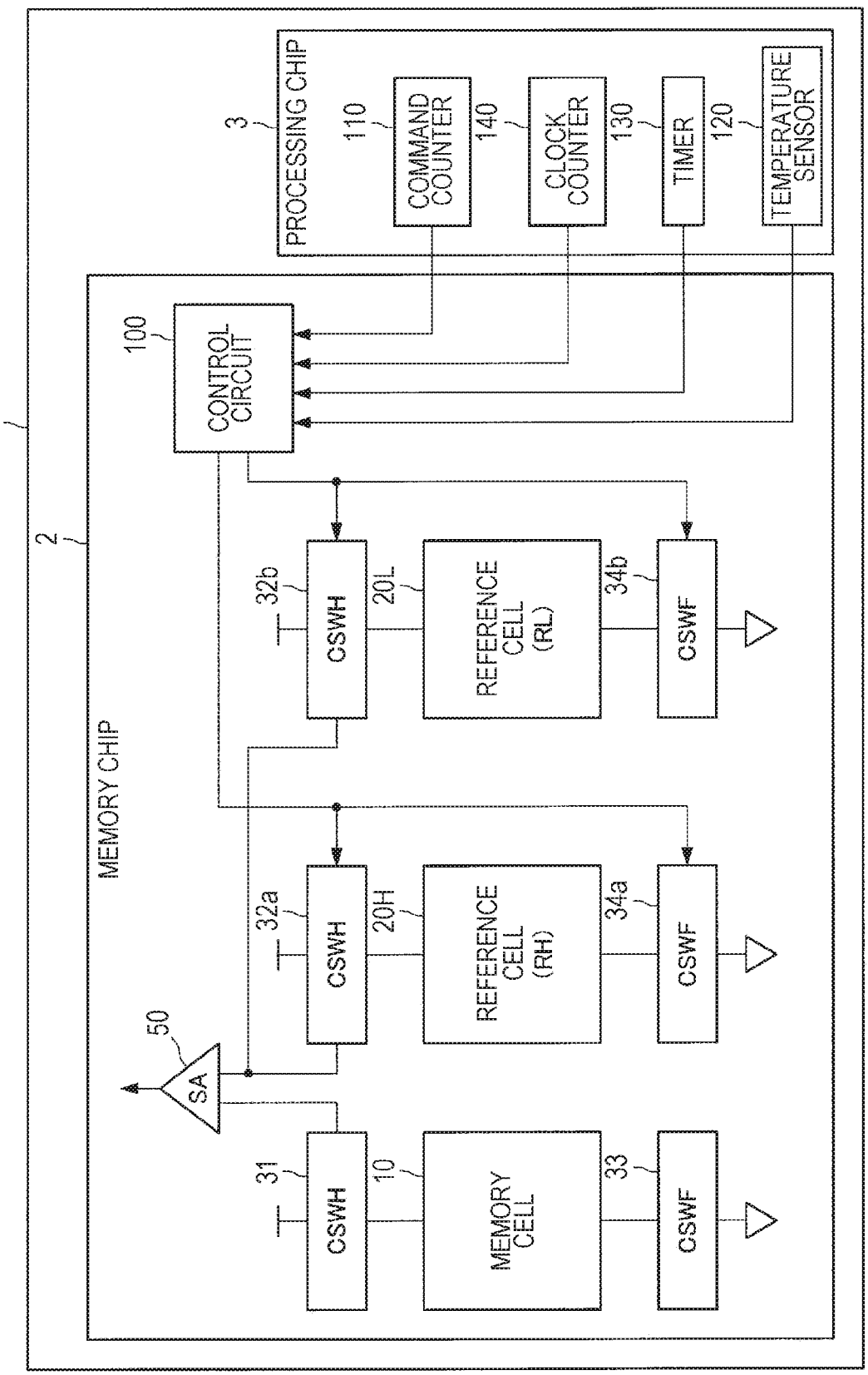
FIG. 14 is an explanatory diagram showing an example of a configuration of the semiconductor memory device 1 according to the same embodiment.

In the semiconductor memory device 1 according to the embodiment of the present disclosure, all configurations may be formed on one chip, and some configurations may be formed on another chip. FIG. 14 is an explanatory diagram showing a configuration example of the semiconductor memory device 1 according to the embodiment of the present disclosure. For example, the semiconductor memory device 1 may include a memory chip 2 and a processing chip 3. As shown in FIG. 14, the command counter 110 and the temperature sensor 120 may be formed in the processing chip 3, and other configurations may be formed in the memory chip 2. The memory chip 2 and the processing chip 3 may be then mounted on a system in package or a system on chip.

Then, the semiconductor memory device 1 according to the embodiment of the present disclosure can be mounted on various electronic devices. Examples of an electronic device on which the semiconductor memory device 1 according to the embodiment of the present disclosure can be mounted include a smartphone, a tablet terminal, a digital still camera, a digital video camera, a music player, a set top box, a computer, a television, a watch, an active speaker, headsets, a game console, a radio, a measuring instrument, an electronic tag, and a beacon.

Figure 15:
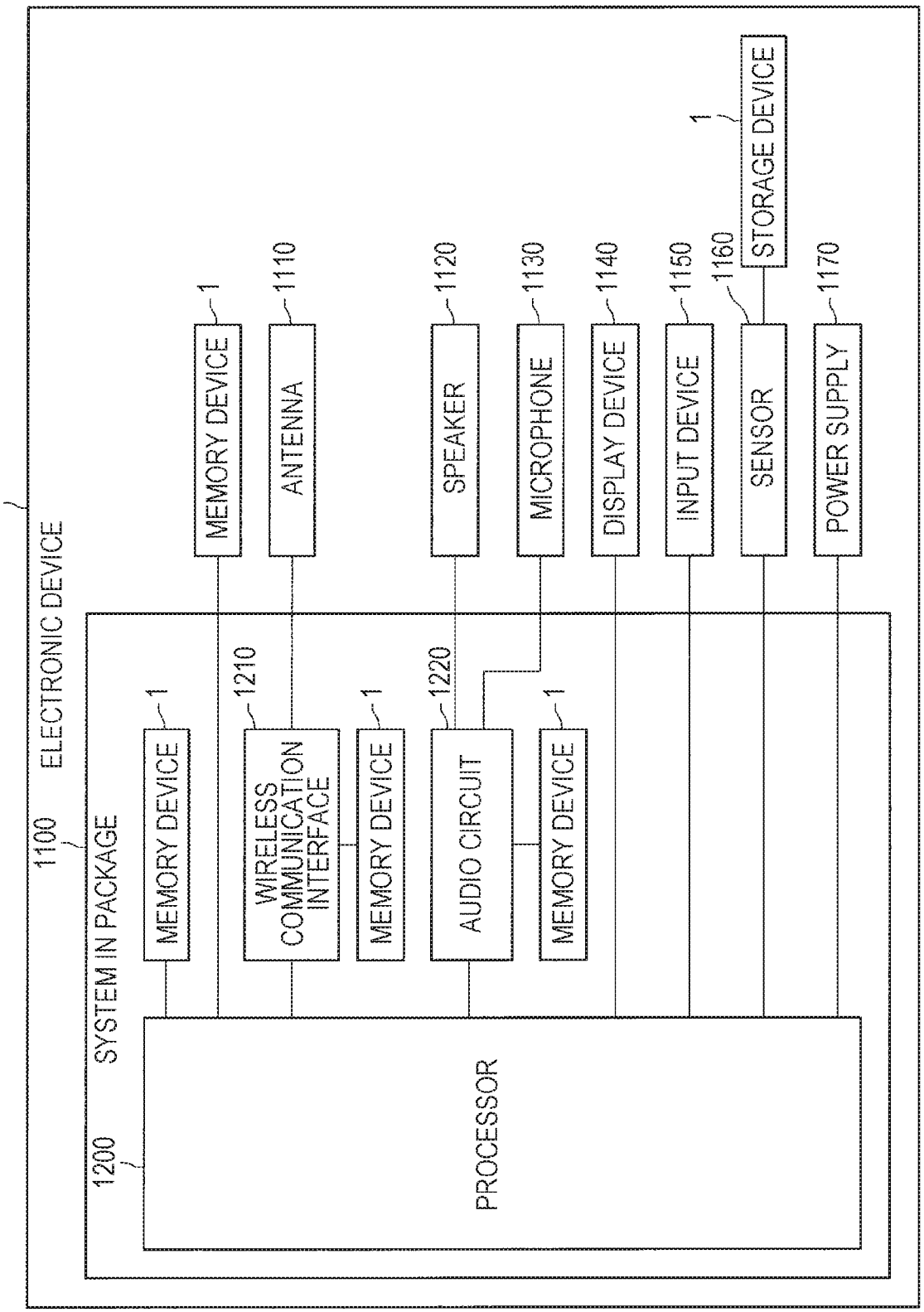
FIG. 15 is an explanatory diagram showing an example of a functional configuration of an electronic device 1000 on which the semiconductor memory device 1 according to the same embodiment can be mounted.

FIG. 15 is an explanatory diagram showing an example of a functional configuration of an electronic device 1000 on which the semiconductor memory device 1 according to the embodiment of the present disclosure can be mounted. The electronic device 1000 shown in FIG. 15 includes a system in package 1100, an antenna 1110, a speaker 1120, a microphone 1130, a display device 1140, an input device 1150, a sensor 1160, and a power supply 1170. Furthermore, the system in package 1100 includes a processor 1200, a wireless communication interface 1210, and an audio circuit 1220.

The antenna 1110 is an antenna for performing mobile communication, wireless LAN, or near field communication, and is connected to the wireless communication interface 1210. The speaker 1120 outputs sound and is connected to the audio circuit 1220. The microphone 1130 is for collecting sound around the electronic device 1000, and is connected to the audio circuit 1220.

The display device 1140 includes, for example, a liquid crystal display, an organic EL display, a light emitting diode (LED) indicator, and the like, and is connected to the processor 1200. The input device 1150 includes, for example, a keyboard, a button, a touch panel, and the like, and is connected to the processor 1200.

The sensor 1160 has functions such as an optical sensor, a position sensor, an acceleration sensor, a living body sensor, a magnetic sensor, a mechanical quantity sensor, a heat sensor, an electric sensor, or a chemical sensor. The variable resistance semiconductor memory device 1 according to the embodiment of the present disclosure may be connected to the sensor 1160. The power supply 1170 supplies power to the electronic device 1000, and is a power supply supplied from, for example, a battery or an AC adapter.

The processor 1200 is an electronic circuit for controlling the operation of the electronic device 1000, and the variable resistance semiconductor memory device 1 according to the embodiment of the present disclosure may be connected to inside or outside the system in package 1100.

The wireless communication interface 1210 has a function of mobile communication, wireless LAN or near field communication. The variable resistance semiconductor memory device 1 according to the embodiment of the present disclosure may be connected to the wireless communication interface 1210. The audio circuit 1220 has a function of controlling the speaker 1120 and the microphone 1130, and the variable resistance semiconductor memory device 1 according to the embodiment of the present disclosure may be connected to the audio circuit 1220.

By mounting the variable resistance semiconductor memory device 1 according to the embodiment of the present disclosure, such an electronic device 1000 can improve the reliability at the time of data read while suppressing the power consumption.

3. CONCLUSION

As described above, according to the embodiment of the present disclosure, provided is the semiconductor memory device 1 that can achieve both reliably preventing the logic inversion of the reference cell, and suppressing the power consumption, and the control circuit 100 that controls operation of the semiconductor memory device 1.

While preferred embodiments of the present disclosure have been described above in detail with reference to the accompanying drawings, the technical scope of the present disclosure is not limited to such examples. It is obvious that various variations and modifications can be conceived within the scope of the technical idea described in the claims by a person having ordinary knowledge in the field of technology to which the present disclosure belongs, and, of course, it is understood that these variations and modifications belong to the technical scope of present disclosure.

Furthermore, the effects described in the present specification are merely illustrative or exemplary, and are not limitative. That is, the technique according to the present disclosure can exhibit other effects obvious to those skilled in the art from the description of the present specification together with the effects described above or instead of the effects described above.

Note that the following configuration is also within the technical scope of the present disclosure.

(1)

A control circuit that performs control to separate from a sense amplifier a second reference element set to a predetermined resistance state, the second reference element being different from a first reference element set to a predetermined resistance state and connected to the sense amplifier in generating a reference potential used for data read through the sense amplifier from a memory cell.

(2)

The control circuit according to (1) described above, in which control is performed to perform write processing on at least the one second reference element in a state where the second reference element is separated from the sense amplifier.

(3)

The control circuit according to (2) described above, in which when it is detected that a command for read processing is generated while the write processing is being performed on the second reference element, after completion of the read processing, control is performed to connect the second reference element for which the write processing has been completed to the sense amplifier.

(4)

A semiconductor memory device including:
a memory cell;
a first reference element set to a predetermined resistance state in generating a reference potential used for data read through a sense amplifier from the memory cell;
a second reference element set to a predetermined resistance state in generating the reference potential used for the data read through the sense amplifier from the memory cell; and
a control circuit that performs control to connect the first reference element to the sense amplifier, and separate the second reference element from the sense amplifier in generating the reference potential used for the data read through the sense amplifier from the memory cell.

(5)

The semiconductor memory device according to (4) described above, in which the control circuit performs control to perform write processing on at least the one second reference element in a state where the second reference element is separated from the sense amplifier.

(6)

The semiconductor memory device according to (5) described above, in which when it is detected that a command for reading is generated while the write processing is being performed on the second reference element, after completion of the write processing, the control circuit performs control to connect the second reference element for which the write processing has been completed to the sense amplifier.

(7)

The semiconductor memory device according to any one of (4) to (6) described above, in which the memory cell includes a variable resistance memory element.

(8)

The semiconductor memory device according to (7) described above, in which the memory cell includes a variable magnetoresistance memory element.

(9)

An information processing device including at least the one semiconductor memory device according to any one of 4) to (8) described above.

(10)

A control method including performing control to separate from a sense amplifier a second reference element set to a predetermined resistance state, the second reference element being different from a first reference element set to a predetermined resistance state and connected to the sense amplifier in generating a reference potential used for data read through the sense amplifier from a memory cell.

REFERENCE SIGNS LIST

1 Semiconductor memory device
100 Control circuit

The invention claimed is:

1. A device, comprising:
a control circuit configured to:
control connection of a first reference element to a sense amplifier, wherein the first reference element is in a first resistance state;
control disconnection of a second reference element from the sense amplifier, wherein
the second reference element is in a second resistance state, and
the second reference element is different from the first reference element;
control the first reference element to generate a reference potential based on the connection of the first reference element to the sense amplifier, wherein the sense amplifier reads data from a memory cell based on the reference potential; and
control execution of a write process on the second reference element based on the disconnection of the second reference element from the sense amplifier.

2. The control circuit according to claim 1, wherein
the control circuit is further configured to control connection of the second reference element to the sense amplifier after completion of a read process associated with a read command, and
the connection of the second reference element to the sense amplifier is controlled based on completion of the execution of the write process on the second reference element and generation of the read command during the execution of the write process on the second reference element.

3. A semiconductor memory device, comprising:
a memory cell;
a first reference element in a first resistance state;
a second reference element in a second resistance state; and
a control circuit configured to:
control connection of the first reference element to a sense amplifier;
control disconnection of the second reference element from the sense amplifier;
control the first reference element to generate a reference potential based on the connection of the first reference element to the sense amplifier, wherein the sense amplifier reads data from the memory cell based on the reference potential; and
control execution of a write process on the second reference element based on the disconnection of the second reference element from the sense amplifier.

4. The semiconductor memory device according to claim 3, wherein
the control circuit is further configured to control connection of the second reference element to the sense amplifier after completion of the execution of the write process on the second reference element, and
the connection of the second reference element to the sense amplifier is controlled based on generation of a read command during the execution of the write process on the second reference element.

5. The semiconductor memory device according to claim 3, wherein the memory cell includes a variable resistance memory element.

6. The semiconductor memory device according to claim 3, wherein the memory cell includes a variable magnetoresistance memory element.

7. An information processing device, comprising:
a semiconductor memory device wherein the semiconductor memory device includes:
a memory cell;
a first reference element in a first resistance state;
a second reference element in a second resistance state; and
a control circuit configured to:
control connection of the first reference element to a sense amplifier;
control disconnection of the second reference element from the sense amplifier;
control the first reference element to generate a reference potential based on the connection of the first reference element to the sense amplifier, wherein the sense amplifier reads data from the memory cell based on the reference potential; and
control execution of a write process on the second reference element based on the disconnection of the second reference element from the sense amplifier.

8. A control method, comprising:
controlling connection of a first reference element to a sense amplifier, wherein the first reference element is in a first resistance state;
controlling disconnection of a second reference element from the sense amplifier, wherein
the second reference element is in a second resistance state, and
the second reference element is different from the first reference element;
controlling the first reference element to generate a reference potential based on the connection of the first reference element to the sense amplifier, wherein the sense amplifier reads data from a memory cell based on the reference potential; and
controlling execution of a write process on the second reference element based on the disconnection of the second reference element from the sense amplifier.

* * * * *